(12) United States Patent
Abatake et al.

(10) Patent No.: US 11,088,674 B2
(45) Date of Patent: Aug. 10, 2021

(54) SAW FILTER MANUFACTURING METHOD AND SAW FILTER

(71) Applicant: DISCO CORPORATION, Tokyo (JP)

(72) Inventors: Jun Abatake, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 24 days.

(21) Appl. No.: 16/840,729

(22) Filed: Apr. 6, 2020

(65) Prior Publication Data

US 2020/0343878 A1 Oct. 29, 2020

(30) Foreign Application Priority Data

Apr. 23, 2019 (JP) .............................. JP2019-082145

(51) Int. Cl.
*H03H 9/02* (2006.01)
*H03H 9/64* (2006.01)
*H01L 41/332* (2013.01)
*H01L 41/33* (2013.01)

(52) U.S. Cl.
CPC ........... *H03H 9/6413* (2013.01); *H01L 41/33* (2013.01); *H03H 9/02275* (2013.01); *H03H 9/02559* (2013.01)

(58) Field of Classification Search
CPC .. H03H 9/02622; H03H 9/02685; H03H 9/64; H03H 9/6413; H01L 41/332
See application file for complete search history.

(56) References Cited

U.S. PATENT DOCUMENTS

| 5,998,907 A | * | 12/1999 | Taguchi | H03H 9/02574 |
| | | | | 310/313 R |
| 7,486,006 B2 | * | 2/2009 | Aigner | H03H 9/02102 |
| | | | | 310/324 |
| 8,186,028 B2 | * | 5/2012 | Aigner | H03H 9/02102 |
| | | | | 29/25.35 |
| 10,050,599 B2 | * | 8/2018 | Abatake | H03H 9/09 |

FOREIGN PATENT DOCUMENTS

JP 2003008396 A 1/2003

* cited by examiner

*Primary Examiner* — Dean O Takaoka
(74) *Attorney, Agent, or Firm* — Greer Burns & Crain Ltd.

(57) ABSTRACT

There is provided a SAW filter manufacturing method for manufacturing a SAW filter from a piezoelectric substrate having planned dividing lines set on a top surface of the piezoelectric substrate, and having a device including comb-shaped electrodes in regions demarcated by the planned dividing lines. The method includes a structure forming step of forming a structure having projections and depressions on an undersurface side of the piezoelectric substrate by irradiating the piezoelectric substrate with a laser beam of a wavelength absorbable by the piezoelectric substrate from the undersurface side of the piezoelectric substrate, and a dividing step of dividing the piezoelectric substrate along the planned dividing lines after the structure forming step.

4 Claims, 5 Drawing Sheets

SAW FILTER MANUFACTURING METHOD AND SAW FILTER

FIELD OF THE INVENTION

The present invention relates to a surface acoustic wave (SAW) filter manufacturing method and a SAW filter.

DESCRIPTION OF THE RELATED ART

A wireless communication apparatus such as a mobile phone uses a band-pass filter that passes only an electric signal in a desired frequency band. A SAW filter using a surface acoustic wave propagating on a piezoelectric substrate is used as the band-pass filter. The frequency characteristic of the SAW filter may be degraded when a part of an elastic wave occurring in a vicinity of an electrode on an input side propagates within a crystal substrate and is reflected on an undersurface side, and the reflected elastic wave reaches an electrode on an output side and becomes a spurious component as a signal component in an unintended frequency band. For this phenomenon, a technology has been proposed which forms a minute uneven structure on the undersurface of the crystal substrate so that the elastic wave is scattered easily, and thereby prevents the reflected elastic wave from reaching the electrode (see Japanese Patent Laid-Open No. 2003-008396).

SUMMARY OF THE INVENTION

However, in a case where the uneven structure is formed by undersurface grinding as disclosed in Japanese Patent Laid-Open No. 2003-008396, the reflected elastic wave cannot be controlled, and there is thus a problem of being unable to entirely prevent the arrival of the elastic wave at the electrode on the output side. In addition, in a case where an inside of a margin area at an outer peripheral edge of the SAW filter formed into an individual piece is formed into a rough surface as disclosed in Japanese Patent Laid-Open No. 2003-008396, a mask needs to be formed to realize this by etching or blasting, and there is thus a different problem in that labor and cost are involved.

It is accordingly an object of the present invention to provide a SAW filter manufacturing method and a SAW filter that can control the reflection of the elastic wave.

In accordance with an aspect of the present invention, there is provided a SAW filter manufacturing method for manufacturing a SAW filter from a piezoelectric substrate having planned dividing lines set on a top surface of the piezoelectric substrate, and having a device including comb-shaped electrodes in regions demarcated by the planned dividing lines. The SAW filter manufacturing method includes a structure forming step of forming a structure having projections and depressions on an undersurface side of the piezoelectric substrate by irradiating the piezoelectric substrate with a laser beam of a wavelength absorbable by the piezoelectric substrate from the undersurface side of the piezoelectric substrate, and a dividing step of dividing the piezoelectric substrate along the planned dividing lines after the structure forming step. A distance from a vertex of a projecting portion to a bottom surface of a recessed portion in the structure having the projections and the depressions formed in the structure forming step is set at 1 μm or more.

In the structure forming step, the laser beam may be applied excluding a predetermined region including a region corresponding to a planned dividing line of the piezoelectric substrate so that the structure having the projections and the depressions is not formed in the predetermined region including an outer peripheral edge portion on an undersurface side of the device after division.

In addition, according to another aspect of the present invention, there is provided a SAW filter including comb-shaped electrodes on a top surface of a piezoelectric substrate, and a structure having projections and depressions formed on an undersurface side of the piezoelectric substrate. A distance from a vertex of a projecting portion to a bottom surface of a recessed portion in the structure having the projections and the depressions is 1 μm or more.

The structure having the projections and the depressions may be formed excluding a predetermined region including an outer peripheral edge portion on the undersurface side of the piezoelectric substrate.

According to the present invention, it is possible to form a SAW filter that can control the reflection of an elastic wave.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A mode for carrying out the present invention (embodiment) will be described in detail with reference to the drawings. The present invention is not limited by contents described in the following embodiment. In addition, constituent elements to be described in the following include constituent elements readily conceivable by those skilled in the art and essentially identical constituent elements. Further, configurations to be described in the following can be combined with each other as appropriate. In addition, various omissions, replacements, or modifications of configurations can be performed without departing from the spirit of the present invention.

EMBODIMENT

Figure 1:
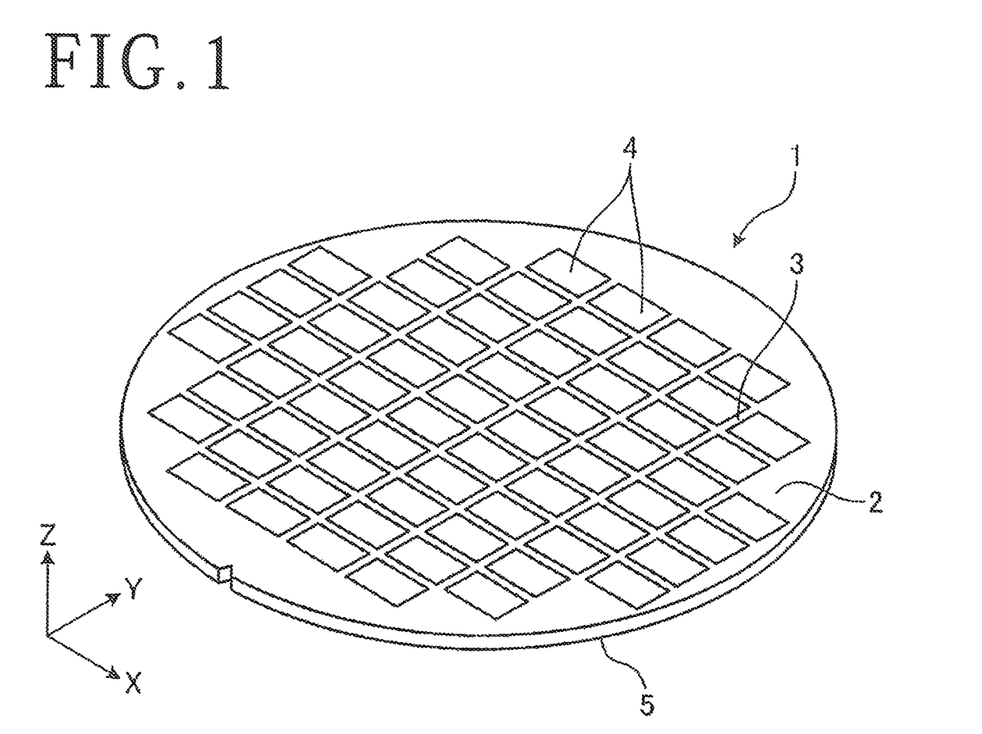
FIG. 1 is a perspective view of a piezoelectric substrate as a manufacturing target of a SAW filter manufacturing method according to an embodiment.

A SAW filter manufacturing method according to an embodiment of the present invention will be described with reference to the drawings. FIG. 1 is a perspective view of a piezoelectric substrate 1 as a manufacturing target of the SAW filter manufacturing method according to the embodiment. The piezoelectric substrate 1 in the present embodiment is a disk-shaped lithium tantalate (LT) substrate formed of lithium tantalate (LiTaO$_3$) or a disk-shaped lithium niobate (LN) substrate formed of lithium niobate (LiNbO$_3$). The piezoelectric substrate 1 in the present embodiment has a thickness of approximately 130 μm. As depicted in FIG. 1, a plurality of planned dividing lines 3 intersecting each other (orthogonal to each other in the embodiment) are set on a top surface 2 of the piezoelectric substrate 1, and a device 4 including comb-shaped electrodes (interdigital transducers (IDTs)) 11 to be described later (see FIG. 7) is formed in each of regions of the top surface 2 which regions are demarcated by the planned dividing lines 3.

Figure 2:
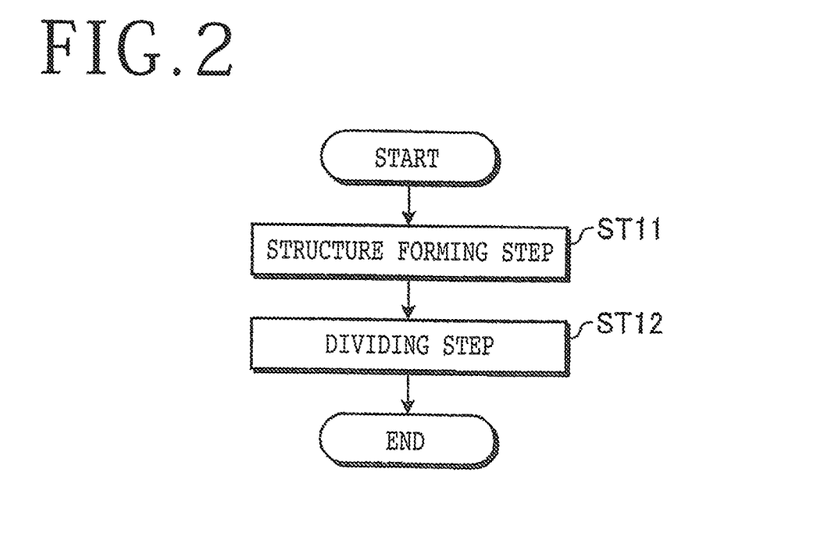
FIG. 2 is a flowchart depicting the SAW filter manufacturing method according to the embodiment.

The SAW filter manufacturing method according to the embodiment will next be described. FIG. 2 is a flowchart depicting the SAW filter manufacturing method according to the embodiment. The SAW filter manufacturing method is a method of manufacturing a SAW filter 10 (see FIG. 7 and FIG. 8) to be described later from the piezoelectric substrate 1. The SAW filter manufacturing method includes a structure forming step ST11 and a dividing step ST12, as depicted in FIG. 2.

Figure 3:
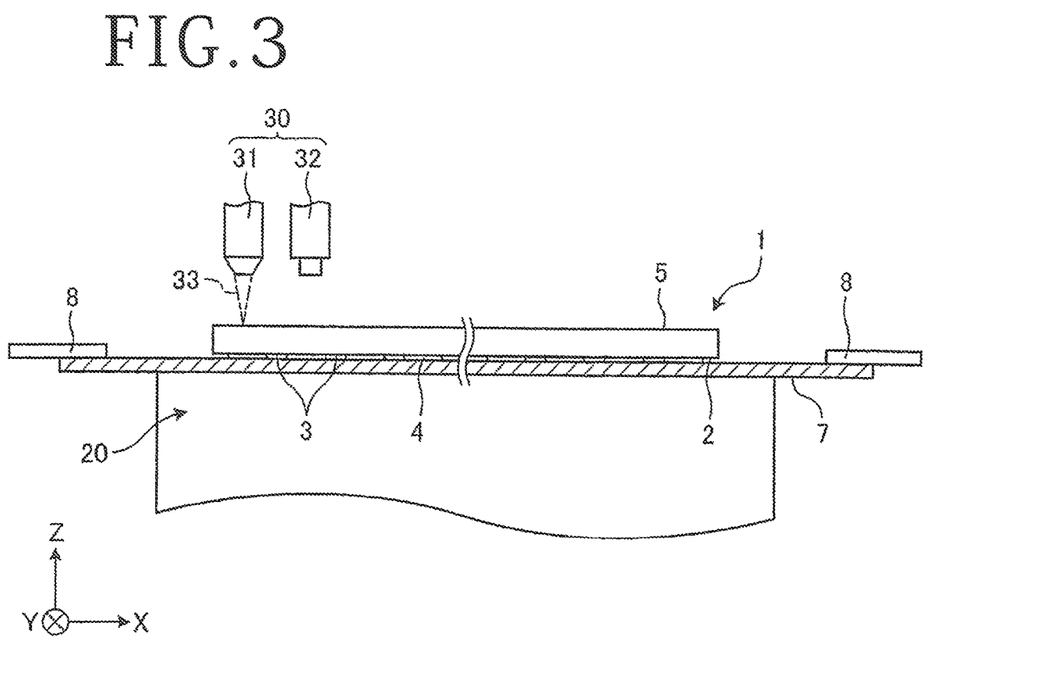
FIG. 3 is a sectional view depicting a state of a structure forming step in FIG. 2.
Figure 4:
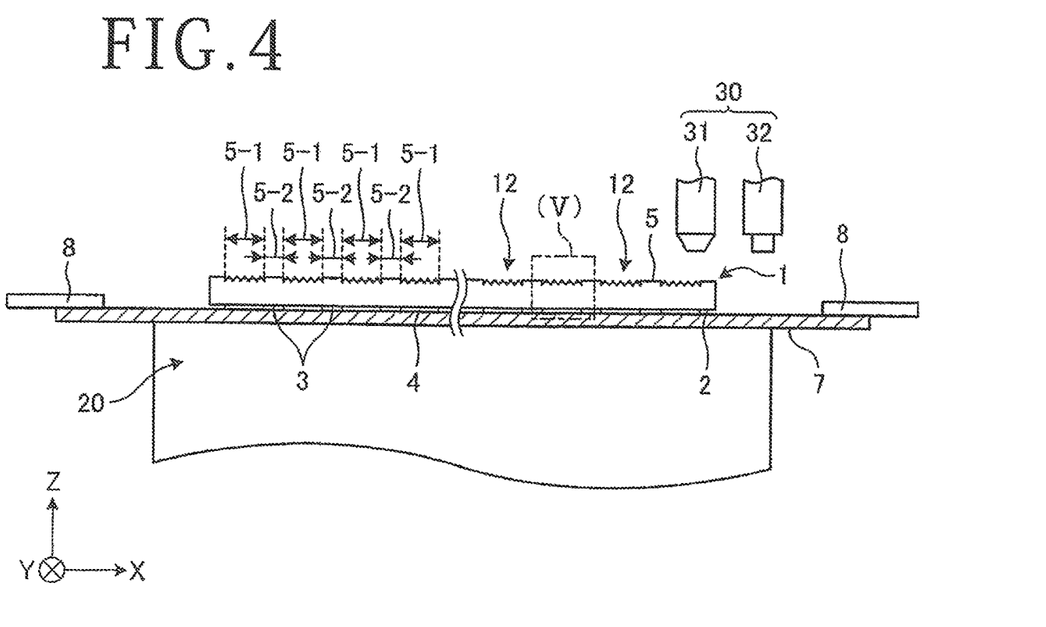
FIG. 4 is a sectional view depicting a state after FIG. 3 of the structure forming step in FIG. 2.
Figure 5:
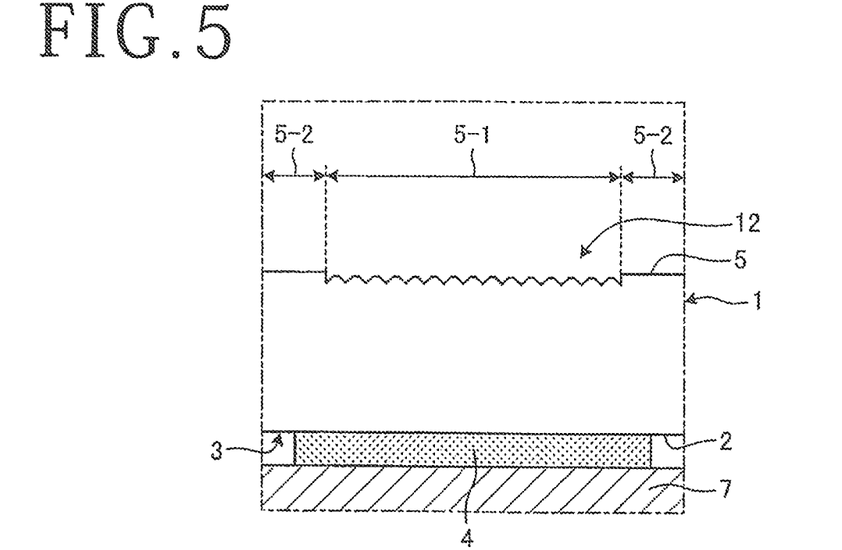
FIG. 5 is an enlarged view in which (V) in FIG. 4 is enlarged.

FIG. 3 is a sectional view depicting a state of the structure forming step ST11 in FIG. 2. FIG. 4 is a sectional view depicting a state after FIG. 3 of the structure forming step ST11 in FIG. 2. FIG. 5 is an enlarged view in which (V) in FIG. 4 is enlarged. The structure forming step ST11 is a step of irradiating the piezoelectric substrate 1 with a laser beam 33 of a wavelength absorbable by the piezoelectric substrate 1 from an undersurface 5 side of the piezoelectric substrate 1, as depicted in FIG. 3, and thereby forming a structure 12 having projections and depressions on the undersurface 5 side of the piezoelectric substrate 1, as depicted in FIG. 4 and FIG. 5.

Specifically, in the structure forming step ST11, first, as depicted in FIG. 3, a dicing tape 7 as an adhesive tape having a larger diameter than the piezoelectric substrate 1 is affixed to the top surface 2 of the piezoelectric substrate 1, an annular frame 8 is affixed to a periphery of the dicing tape 7, and a chuck table 20 thereafter holds the top surface 2 side of the piezoelectric substrate 1 via the dicing tape 7.

In the structure forming step ST11, next, an imaging apparatus 32 of a laser processing unit 30 images the undersurface 5 side of the piezoelectric substrate 1 on the chuck table 20, and alignment is carried out which performs positioning between the piezoelectric substrate 1 on the chuck table 20 and the irradiation position of the laser beam 33 applied by a laser beam irradiating unit 31 of the laser processing unit 30.

In the structure forming step ST11, next, as depicted in FIG. 3, the laser beam irradiating unit 31 subjects the undersurface 5 side of the piezoelectric substrate 1 to laser processing by applying the laser beam 33. As depicted in FIG. 4 and FIG. 5, a structure 12 is thereby formed on the undersurface 5 side of the piezoelectric substrate 1.

In addition, in the structure forming step ST11, the structure 12 that scatters an elastic wave within a range of 2 GHz to 5 GHz both inclusive as a frequency band handled by the SAW filter 10 is formed. The piezoelectric substrate 1 has various propagation modes according to a cut angle. However, a propagation speed of the elastic wave is approximately 4000 m/s in the piezoelectric substrate 1. Thus, the wavelength of the elastic wave is approximately within a range of 0.8 μm to 2.0 μm both inclusive in the SAW filter 10 with the frequency band of 2 GHz to 5 GHz. Therefore, the structure 12 having projections and depressions formed in the structure forming step ST11 is set in a shape that can shift a propagation length by the wavelength of the elastic wave or more. That is, in the structure 12 formed in the structure forming step ST11, a distance in a thickness direction (a Z-axis direction or a direction of the projections and the depressions) of the piezoelectric substrate 1 from a vertex of a projecting portion to a bottom surface of a recessed portion is set to at least 1 μm or more, preferably set to 2 μm or more or set to 3 μm or more.

In the structure forming step ST11, the structure 12 is formed by the laser beam 33 rather than undersurface grinding, etching, and blasting in the past, and thus, the projections and depressions of the structure 12 can be controled in μm units. Therefore, in the structure forming step ST11, the wavelength range of the elastic wave that the manufactured SAW filter 10 can reflect by the structure 12 formed on the undersurface 5 side can be controled in μm units.

In the structure forming step ST1, the structure 12 is formed by, for example, what is generally called a Hasen Cut (registered trademark) that performs laser processing while repeating turning ON and OFF of the laser beam 33 in set cycles, scanning of the laser beam 33 by a scanning mechanism including a galvanoscanner, a resonant scanner, an acoustooptic deflection element, a polygon mirror, or the like. Specifically, in the structure forming step ST11, scanning while repeating turning ON and OFF of the laser beam 33 is performed. For example, in the structure forming step ST11, a region in which to form a recessed portion in the structure 12 is irradiated with the laser beam 33 in an ON state for a long time, a region in which to form a projecting portion in the structure 12 is irradiated with the laser beam 33 in an ON for a short time, and the laser beam 33 is turns OFF to pass a region in which the structure 12 is not to be formed.

In the structure forming step ST11, the laser beam 33 is preferably applied excluding a predetermined region 5-2 depicted in FIG. 4 so that the structure 12 having projections and depressions is not formed in the predetermined region 5-2. Here, the predetermined region 5-2 is a region including a region corresponding to a planned dividing line 3 of the piezoelectric substrate 1 and an outer peripheral edge portion 13-2 (see FIG. 8) on the undersurface 5 side of the SAW filter 10 in the form of an individual piece after division. That is, in the structure forming step ST11, the structure 12 is preferably formed by applying the laser beam 33 to a predetermined region 5-1 depicted in FIG. 4 on the undersurface 5 of the piezoelectric substrate 1, the region 5-1 corresponding to a central region 13-1 (see FIG. 8) on the undersurface 5 side of the SAW filter 10, while avoiding the predetermined region 5-2. Thereby, the structure 12 in the central region 13-1 as a region that the elastic wave may reach can be formed in the structure forming step ST11.

In addition, in the present embodiment, as depicted in FIG. 4, the predetermined region 5-1 in which the structure 12 is formed by applying the laser beam 33 and the predetermined region 5-2 in which the application of the laser beam 33 is avoided are periodically arranged in the surface direction of the piezoelectric substrate 1. Therefore, in the structure forming step ST11, the structure 12 can be formed accurately and efficiently by making use of the Hasen Cut (registered trademark), the scanning of the laser beam 33, or the like.

Figure 6:
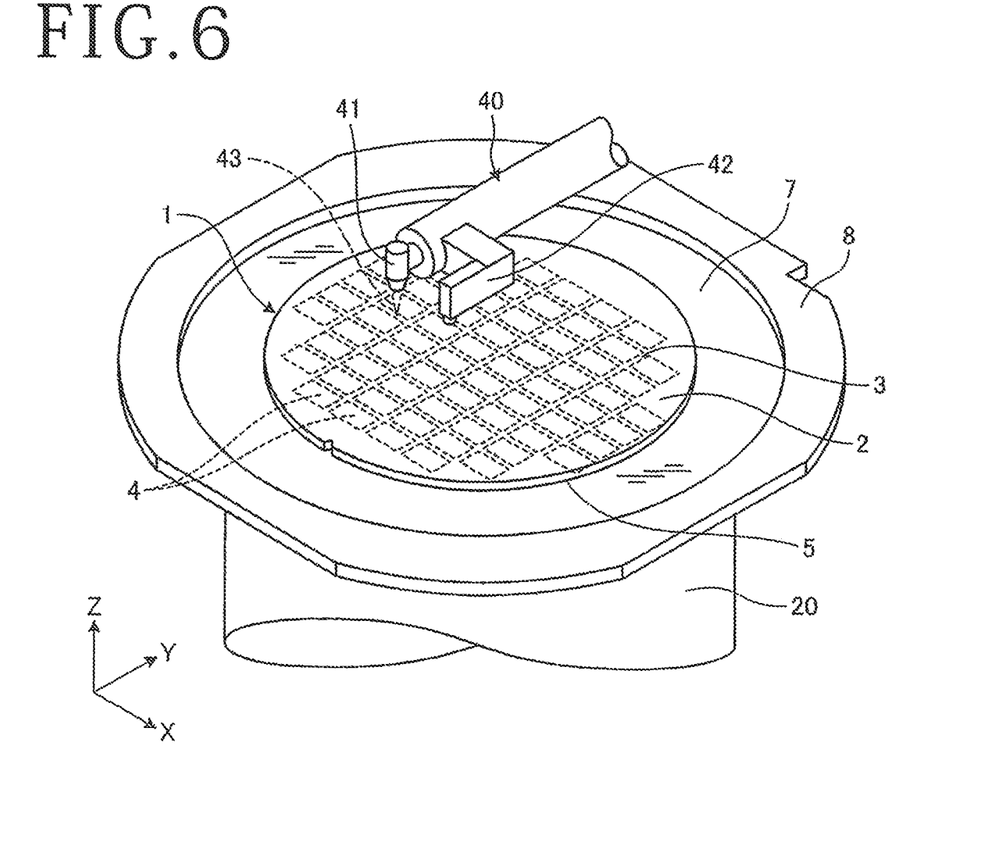
FIG. 6 is a perspective view depicting an example of a dividing step in FIG. 2.

FIG. 6 is a perspective view depicting an example of the dividing step ST12 in FIG. 2. As depicted in FIG. 6, the dividing step ST12 is a step of dividing the piezoelectric substrate 1 along the planned dividing lines 3 after the structure forming step ST1.

Specifically, as depicted in FIG. 6, in the dividing step ST12, the piezoelectric substrate 1 is divided by laser processing that applies a laser beam 43 along the planned dividing lines 3 by a laser beam irradiating unit 41 after carrying out alignment using an imaging apparatus 42 of the laser processing unit 40, the alignment performing positioning between the piezoelectric substrate 1 on the chuck table 20 and the irradiation position of a laser beam 43 applied by the laser beam irradiating unit 41 of a laser processing unit 40. Incidentally, a laser processing unit similar to the laser processing unit 30 may be used as the laser processing unit 40.

The dividing step ST12 may be what is generally called a stealth dicing that forms a modified layer within the piezoelectric substrate 1 by condensing the laser beam 43 within the piezoelectric substrate 1, and thereafter divides the piezoelectric substrate 1 by tape expansion or the like, or may be what is generally called ablation processing that sublimates and vaporizes the solid of the piezoelectric substrate 1 by concentrating an energy of the laser beam 43 on a minute area of the piezoelectric substrate 1 for a very short time, and thereby divides the piezoelectric substrate 1.

As described above, the SAW filter manufacturing method according to the embodiment performs the structure forming step ST11 first, and performs the dividing step ST12 later. Therefore, structures 12 can be formed on the undersurface 5 side for a plurality of SAW filters 10 arranged in the piezoelectric substrate 1 by one process of the structure forming step ST11. It is thus possible to manufacture the SAW filters 10 in which the structures 12 have small structural variations while reducing cost and labor.

Figure 7:
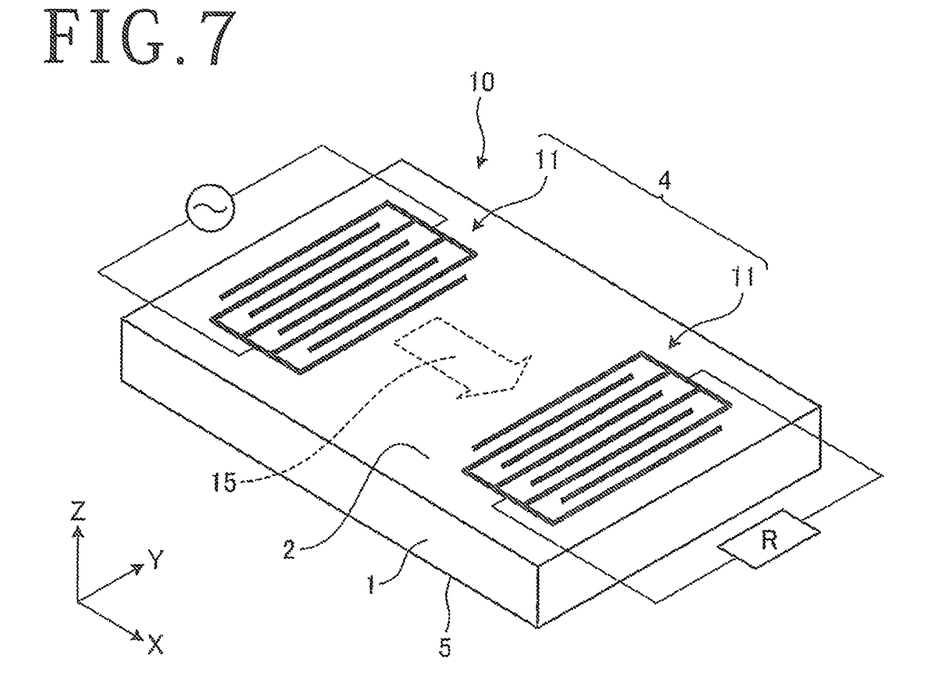
FIG. 7 is a perspective view depicting a top surface side of a SAW filter manufactured by the SAW filter manufacturing method according to the embodiment.
Figure 8:
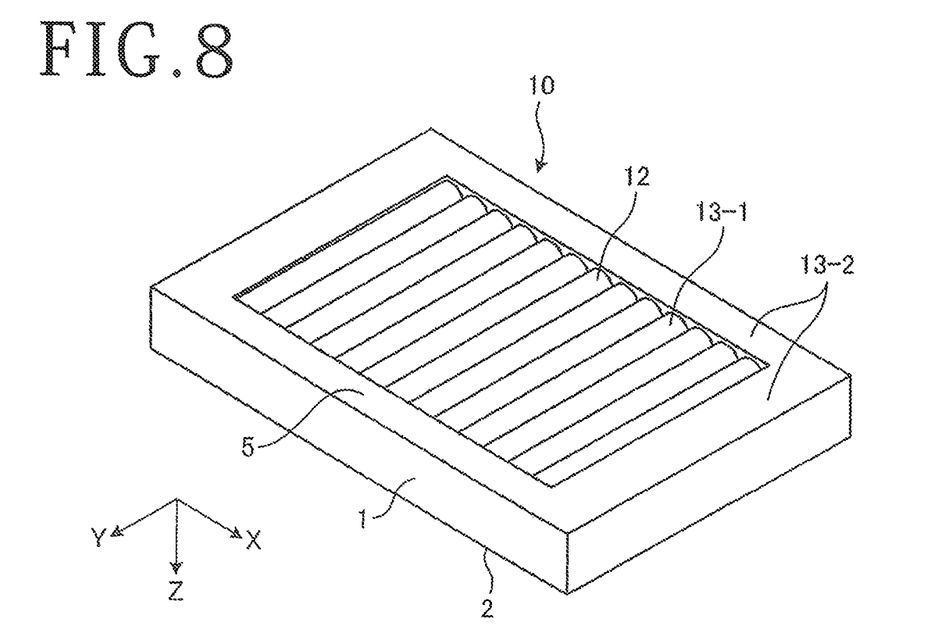
FIG. 8 is a perspective view depicting an undersurface side of the SAW filter manufactured by the SAW filter manufacturing method according to the embodiment.

FIG. 7 is a perspective view depicting the top surface 2 side of a SAW filter 10 manufactured by the SAW filter manufacturing method according to the embodiment. FIG. 8 is a perspective view depicting the undersurface 5 side of the SAW filter 10 manufactured by the SAW filter manufacturing method according to the embodiment. The SAW filter 10 according to the embodiment which SAW filter is depicted in FIG. 7 and FIG. 8 is manufactured by subjecting the piezoelectric substrate 1 to the structure forming step ST11 and the dividing step ST12 described above.

As depicted in FIG. 7 and FIG. 8, the SAW filter 10 includes the piezoelectric substrate 1, a pair of comb-shaped electrodes 11 (device 4) arranged on the top surface 2 of the piezoelectric substrate 1 so as to be opposed to each other in a longitudinal direction, and the structure 12 having projections and depressions formed on the undersurface 5 side of the piezoelectric substrate 1.

The SAW filter 10 converts an input electric signal into a high frequency signal by one comb-shaped electrode 11 on an input side, converts this high frequency signal into a surface wave 15 of a wavelength within a wavelength range of approximately 0.8 µm to 2.0 µm both inclusive by a piezoelectric effect of the piezoelectric substrate 1, filters a predetermined wavelength by propagating the surface wave 15 on the piezoelectric substrate 1, thereafter extracts the surface wave 15 as a high frequency signal obtained by filtering a predetermined frequency by the other comb-shaped electrode 11 on an output side, converts the high frequency signal into an electric signal, and outputs the electric signal. The SAW filter 10 allows the predetermined frequency filtered in the high frequency signal to be set by changing an interval and a length of the comb-shaped electrodes 11.

The structure 12 is formed in the structure forming step ST11. As depicted in FIG. 8, the structure 12 is formed in the central region 13-1 as a region corresponding to the pair of comb-shaped electrodes 11 and a region between the pair of comb-shaped electrodes 11 excluding the outer peripheral edge portion 13-2 of the undersurface 5 side of the piezoelectric substrate 1, the outer peripheral edge portion 13-2 being on the outer peripheral side of the region corresponding to the pair of comb-shaped electrodes 11.

In the present embodiment, as depicted in FIG. 8, the structure 12 has projecting portions and recessed portions alternately arranged along an X-axis direction as an opposing direction of the pair of comb-shaped electrodes 11. The structure 12 in the present invention is not limited to this. The arrangement direction of the projecting portions and the recessed portions may be along a Y-axis direction orthogonal to the opposing direction of the pair of comb-shaped electrodes 11, or may be along any direction within an XY plane. In addition, the structure 12 may have the projecting portions and the recessed portions alternately arranged along both the X-axis direction and the Y-axis direction, or may have the projecting portions and the recessed portions alternately arranged along each of two freely-selected directions within the XY plane.

In the present embodiment, a distance in the arrangement direction of the projecting portions and the recessed portions from the vertex of a projecting portion to the bottom surface of a recessed portion in the structure 12 is preferably within a range of 10 to 100 µm both inclusive, and is, for example, set to approximately 50 µm. The structure 12 has the arrangement structure of the projecting portions and the recessed portions at such small arrangement intervals. Therefore, it is difficult to form the structure 12 by undersurface grinding, etching, and blasting in the past. The structure 12 can be formed accurately and efficiently by suitably making use of the Hasen Cut (registered trademark), the scanning of the laser beam 33, or the like in the structure forming step ST11 according to the present embodiment.

The structure 12 in the present embodiment further has a periodic structure in which the arrangement structure of the projecting portions and the recessed portions has periodicity in the arrangement direction. The structure 12 can therefore control functions of reflecting and scattering the elastic wave at uniform levels without depending on a position within the central region 13-1 in which the structure 12 is formed. Incidentally, the structure 12 in the present invention is not limited to these, but the structure 12 may have an irregularly rough structure without having a periodic structure.

The SAW filter manufacturing method according to the embodiment is a method of manufacturing the SAW filter 10 from the piezoelectric substrate 1 having the device 4 including the comb-shaped electrodes 11 in a region demarcated by planned dividing lines 3, the planned dividing lines 3 being set on the top surface 2. The SAW filter manufacturing method according to the embodiment includes the structure forming step ST11 of forming the structure 12 having projections and depressions on the undersurface 5 side of the piezoelectric substrate 1 by irradiating the piezoelectric substrate 1 with the laser beam 33 of a wavelength absorbable by the piezoelectric substrate 1 from the undersurface 5 side of the piezoelectric substrate 1, and the dividing step ST12 of dividing the piezoelectric substrate 1 along the planned dividing lines 3 after the structure forming step ST11. In the SAW filter manufacturing method according to the embodiment, a distance from the vertex of a projecting portion to the bottom surface of a recessed portion in the structure 12 having projections and depressions formed in the structure forming step ST11 is set to 1 µm or more.

Therefore, in the structure forming step ST11 of the SAW filter manufacturing method according to t the embodiment, the structure 12 can be formed with high accuracy by the laser beam 33 on the undersurface 5 side of the SAW filter 10. The SAW filter manufacturing method according to the embodiment thus produces an effect of being able to manufacture the SAW filter 10 that can control the reflection of the elastic wave. The SAW filter manufacturing method according to the embodiment thereby produces an effect of being able to manufacture the SAW filter 10 having the structure 12 formed in the undersurface 5, the structure 12 having an uneven structure that can suppress a spurious component efficiently.

In addition, in the structure forming step ST11 of the SAW filter manufacturing method according to the embodiment, the laser beam 33 is applied excluding the predetermined region 5-2 including a region corresponding to planned dividing lines 3 of the piezoelectric substrate 1 so that the structure 12 having projections and depressions is not formed in the predetermined region 5-2 including the outer peripheral edge portion 13-2 on the undersurface 5 side of the SAW filter 10 as the device 4 after division. Therefore, the SAW filter manufacturing method according to the embodiment can perform maskless processing by the structure forming step ST11 with a margin area provided from the edge of the device 4. The SAW filter manufacturing method according to the embodiment thus produces an effect of being able to manufacture the SAW filter 10 having high transverse rupture strength and high quality while reducing cost.

In addition, the SAW filter 10 according to the embodiment has the comb-shaped electrodes 11 on the top surface 2 of the piezoelectric substrate 1, the structure 12 having projections and depressions is formed on the undersurface 5 side of the piezoelectric substrate 1, and a distance from the vertex of a projecting portion to the bottom surface of a recessed portion in the structure 12 having projections and depressions is 1 µm or more. Therefore, the SAW filter 10 according to the embodiment produces an effect of being able to control the reflection of the elastic wave by the uneven structure of the structure 12. The SAW filter 10 according to the embodiment thereby produces an effect of being able to suppress a spurious component efficiently by the uneven structure of the structure 12.

In addition, in the SAW filter 10 according to the embodiment, the structure 12 having projections and depressions is formed in the central region 13-1 excluding a predetermined region including the outer peripheral edge portion 13-2 on the undersurface 5 side of the piezoelectric substrate 1. Therefore, the SAW filter 10 according to the embodiment produces an effect of being able to efficiently control the reflection of the elastic wave and suppress a spurious component by the uneven structure of the structure 12 formed in the central region 13-1 as a region that the elastic wave may reach.

First Modification

Figure 9:
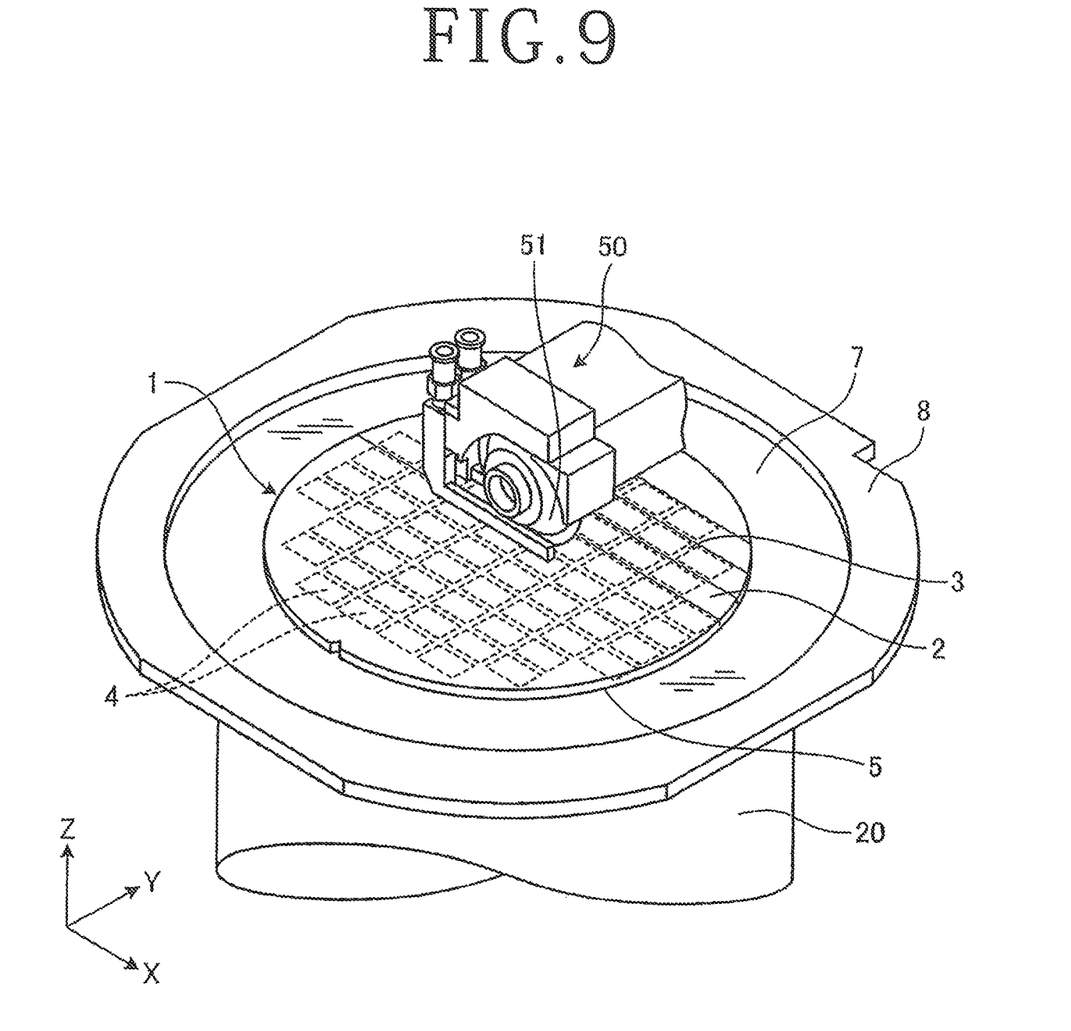
FIG. 9 is a perspective view depicting an example of a dividing step according to a first modification of the embodiment.

A SAW filter manufacturing method according to a first modification of the embodiment of the present invention will be described with reference to a drawing. FIG. 9 is a perspective view depicting an example of a dividing step ST12 according to the first modification of the embodiment. In FIG. 9, the same parts as in the embodiment are identified by the same reference numerals, and description thereof will be omitted.

The SAW filter manufacturing method according to the first modification is the same as in the embodiment except that the dividing step ST12 is different.

As depicted in FIG. 9, in the dividing step ST12 according to the first modification, the piezoelectric substrate 1 is divided by what is generally called a blade dicing that cuts the piezoelectric substrate 1 on the chuck table 20 along the planned dividing lines 3 by a cutting blade 51 by rotating the cutting blade 51 fitted to a cutting apparatus 50 about an axis, and processing-feeding, indexing-feeding, and cutting-feeding the chuck table 20 or the cutting blade 51 of the cutting apparatus 50 by a driving source not depicted in the figure.

In the SAW filter manufacturing method according to the present first modification, the SAW filter 10 in which the structure 12 is formed on the undersurface 5 side of the piezoelectric substrate 1 similar to that of the SAW filter manufacturing method according to the embodiment can be manufactured. The SAW filter manufacturing method according to the present first modification therefore produces effects similar to those of the embodiment.

It is to be noted that the present invention is not limited to the foregoing embodiment. That is, the present invention can be modified and carried out in various manners without departing from the gist of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A surface acoustic wave filter manufacturing method for manufacturing a surface acoustic wave filter from a piezoelectric substrate having planned dividing lines set on a top surface of the piezoelectric substrate, and having a device including comb-shaped electrodes in regions demarcated by the planned dividing lines, the surface acoustic wave filter manufacturing method comprising:
    a structure forming step of forming a structure having projections and depressions on an undersurface side of the piezoelectric substrate by irradiating the piezoelectric substrate with a laser beam of a wavelength absorbable by the piezoelectric substrate from the undersurface side of the piezoelectric substrate; and
    a dividing step of dividing the piezoelectric substrate along the planned dividing lines after the structure forming step,
    a distance from a vertex of a projecting portion to a bottom surface of a recessed portion in the structure having the projections and the depressions formed in the structure forming step being set at 1 µm or more.

2. The surface acoustic wave filter manufacturing method according to claim 1, wherein
    In the structure forming step, the laser beam is applied excluding a predetermined region including a region corresponding to a planned dividing line of the piezoelectric substrate so that the structure having the projections and the depressions is not formed in the predetermined region including an outer peripheral edge portion on an undersurface side of the device after division.

3. A surface acoustic wave filter comprising:
    comb-shaped electrodes on a top surface of a piezoelectric substrate; and a structure having projections and depressions formed on an undersurface side of the piezoelectric substrate, a distance from a vertex of a projecting portion to a bottom surface of a recessed portion in the structure having the projections and the depressions being 1 µm or more.

4. The surface acoustic wave filter according to claim 3, wherein the structure having the projections and the depressions is formed excluding a predetermined region including an outer peripheral edge portion on the undersurface side of the piezoelectric substrate.

* * * * *